United States Patent [19]

Harper

[11] 4,234,903

[45] Nov. 18, 1980

[54] INDUCTIVE LOAD DRIVER CIRCUIT EFFECTING SLOW HOLD CURRENT DELAY AND FAST TURN OFF CURRENT DECAY

[75] Inventor: Patrick D. Harper, Seaford, Va.

[73] Assignee: The Bendix Corporation, Southfield, Mich.

[21] Appl. No.: 881,326

[22] Filed: Feb. 27, 1978

[51] Int. Cl.$^2$ .................... H03K 1/14

[52] U.S. Cl. .................... 361/154; 123/490

[58] Field of Search .................... 361/154, 194, 152; 123/32 EF, 32 EA; 323/20

[56] References Cited

U.S. PATENT DOCUMENTS

| | | | |
|---|---|---|---|
| 3,433,207 | 3/1969 | Bassot et al. | 123/32 EF |
| 3,549,955 | 12/1970 | Paine | 361/155 |
| 3,579,052 | 5/1971 | Kato et al. | 361/194 X |
| 3,628,102 | 12/1971 | Jauch et al. | 361/154 |
| 3,665,901 | 5/1972 | Monpetit et al. | 123/32 EF |
| 3,786,314 | 1/1974 | Misch | 361/194 X |
| 3,786,344 | 1/1974 | Davis et al. | 323/20 |
| 3,786,344 | 1/1974 | Davis et al. | 123/32 EF |
| 3,864,608 | 2/1975 | Normile et al. | 361/154 |
| 3,896,346 | 7/1975 | Ule | 361/154 |
| 4,078,528 | 3/1978 | Hoshi | 123/32 EF |

*Primary Examiner*—J. D. Miller

*Assistant Examiner*—L. C. Schroeder

*Attorney, Agent, or Firm*—Gerald K. Flagg; William A. Marvin; Russel C. Wells

[57] ABSTRACT

An inductive load driver circuit comprising first and second switch means and high and low impedance load current decay means. For the duration of a load actuation signal the first switch means are responsive to the magnitude of the load current to complete and interrupt a first current path to the load to cycle the load current between first and second levels. The second switch means are enabled for the duration of the load actuation signal to complete a second current path to the load when the first switch means interrupts the first current path. When completed the second current path comprises the low impedance decay means allowing the load current to decay slowly from the first current level to the second level to provide during such slow decay a load current sufficient to maintain actuation of the inductive load. The end of the load actuation signal disables the second switch means to interrupt the second current path and thereby require the load current to decay rapidly through the high impedance decay means. In one embodiment, the second switch means comprise an SCR disabled by a final momentarily turn ON of the first switch means.

2 Claims, 4 Drawing Figures

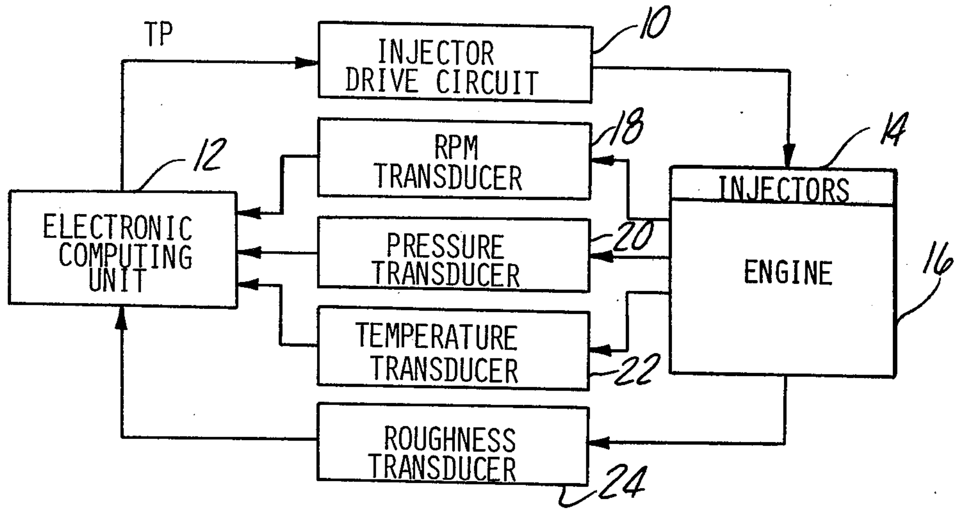
Fig-1
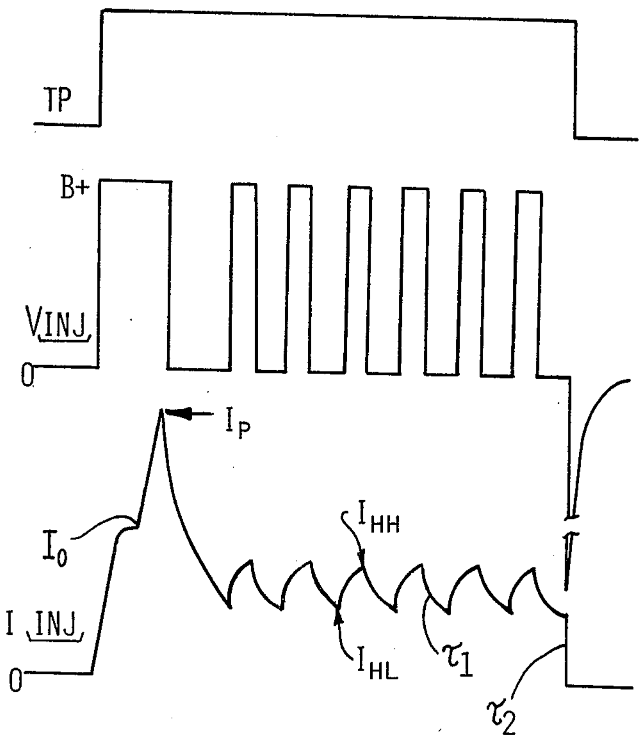
Fig-3a
Fig-3b
Fig-3c

INDUCTIVE LOAD DRIVER CIRCUIT EFFECTING SLOW HOLD CURRENT DELAY AND FAST TURN OFF CURRENT DECAY

CROSS REFERENCE TO RELATED CASES

This application is related to the subject matter of a commonly-assigned United States Patent to Reddy U.S. Pat. No. 3,725,678 issued Apr. 3, 1973 on an application filed as a division of now-abandoned United States patent application Ser. No. 130,349 filed Apr. 1, 1971 and also to the subject matter of a commonly-assigned United States Patent Application Ser. No. 370,140 filed as a continuation of the same United States patent application Ser. No. 130,349. This application is also related to the subject matter (Ser. No's. 881,326, 881,328 and 881,443) of commonly-assigned co-pending applications filed concurrently herewith. The disclosure of each such commonly-assigned case is hereby expressly incorporated herein by reference.

BACKGROUND OF INVENTION

1. Field of Invention

This invention relates generally to circuits for driving inductive loads such as solenoids and, more particularly, to circuits wherein power consumption is minimized by operating a power stage in a switching mode.

2. Description of the Prior Art

The above-identified Reddy cases disclose injector drive circuits wherein the current is controlled to first regulate the voltage across the injector coil until after the current has built up enough to open or "pull in" the injector armature and to thereafter regulate the current at a holding level in excess of a closing or "drop out" current but considerably less than the "pull in" current. These drive circuits render the injector opening and closing times, and therefore the fuel supplied therebetween, substantially independent of variations in the power supply and variations in the unit-to-unit voltage drops across the power stage.

However, in regulating first the voltage and then the hold current, the power stage experiences a voltage drop thereacross corresponding to the difference between the voltage of the power supply and the voltage at the injectors. The power stage therefore consumes and must dissipate power at a level increasing with the number of injectors being driven at one time and the current required to operate each injector. The heat dissipation and therefore the heat sink and temperature ranges associated with these power stages also increase accordingly to the point that the heat sink is often larger than all of the other elements of the electronic control unit leading up to the injectors. Moreover, the temperature cycles produced by the dissipation decrease the life while increasing the mounting costs of the semi-conductor elements comprising the power stage. It is therefore desirable to reduce the power dissipated by the power stage.

The United States patent to Paine U.S. Pat. No. 3,549,955 discloses a circuit for minimizing power consumption by operating the power stage fully ON so that there is a very small voltage drop thereacross until a pull-in current level is detected and thereafter operating the power stage in a switching mode where it is either fully ON or OFF to maintain a hold-in current level in excess of the drop out level. More specifically, the current is alternately increased to an upper hold-in level in excess of the drop out level and is then allowed to decay slowly through the solenoid coil to a lower hold-in level still in excess of the drop-out level. Thereafter, the power stage is switched fully ON again until the upper hold-in level is again detected.

The United States patent to Ule U.S. Pat. No. 3,896,346 discloses an inductive load driver circuit of the type disclosed in the Paine patent but wherein power consumption is further minimized by returning the energy in the collapsing solenoid field to energy storage means in the form of the power supply or a second solenoid.

Citing the Paine patent, the United States patent to Stewart U.S. Pat. No. 4,041,546 discloses a solenoid drive circuit including capacitor timing means for disconnecting the driving voltage for fixed intervals between each application of hold current.

To minimize power consumption, switching-mode decay rates effected by circuits of the type disclosed in Paine, Ule, and Stewart patents must be sufficiently slow to maintain the current above the drop-out level while the power stage is OFF. Using such circuits to control a fuel injector would render the turn off time of the injector, and therefore the fuel delivered thereby, subject to when in the decay cycle it is desired to close the injector. For example, if the end of the injector actuation command coincided with the instant that the current exceeded the upper hold-in level, then the closing time would be the time required to decay to the lower hold-in level plus the time required to decay therefrom to the drop-out level. If the end of the actuation command coincided with the instant that the current fell below the lower hold in level, then the closing time would be just the time required for the current to decay to the drop out level.

Use of circuits of the type disclosed in the Paine, Ule, and Stewart patents to control a fuel injection valve would therefore incur not only the variations in oepning times eliminated by the circuits of the above-identified Reddy cases but would also introduce variations in closing times that would offset a substantial portion of all the variations eliminated by the Reddy circuits.

It is therefore desirable to provide an improved circuit wherein the solenoid current is held above a drop-out level by switching the power stage between fully ON and OFF conditions to reduce power consumption and then rendering the closing time independent of decay rates associated with such hold level switching.

OBJECTS

It is an object of the present invention to provide a new and useful method and an apparatus for controlling the current drive to the solenoid coil of an electromagnetically-actuated device.

It is another object of the present invention to provide a method and apparatus of the foregoing type that minimizes the power consumed after the electromagnetic device has been actuated from one position to another and that minimizes the time required to return the electromagnetic device from the second position to the first.

It is another primary object of the present invention to provide a method and apparatus for activating and deactivating a solenoid operated electromagnetic device wherein current is allowed to flow to the coil of the solenoid through a slow current decay path when it is desired to maintain the device in its activated position and through a fast decay path when it is desired to allow the device to return to its unactivated position.

It is another object of the present invention to provide a method and apparatus of the foregoing type wherein the slow decay path comprises an SCR disabled by a final momentary turn ON of the power switch normally building up the load current.

It is another primary object of the present invention to provide a method and apparatus for controlling the current through an inductive load wherein comparator means respond to sensed levels of load current to generate HIGH and LOW output levels that are fed back to the reference input of the comparator to generate reference voltages representative of first and second levels of load current and that are also applied to switch means to connect and disconnect power to the load so as to maintain the load current between the first and second current levels.

It is another object of the present invention to provide a method and apparatus of the foregoing type wherein flip-flop means cause variable current source means to change the magnitude of current through a sense resistor coupled to the comparator sense input when the load current first exceeds a peak actuation level.

SUMMARY OF INVENTION

An inductive load drive circuit comprises first and second switch means and high and low impedance load current decay means. For the duration of a load actuation signal the first switch means are responsive to the magnitude of the load current to complete and interrupt a first current path to the load to cycle the load current between first and second levels. The second switch means are enabled for the duration of the load actuation signal to complete a second current path to the load when the first switch means interrupts the first current path. When completed the second current path comprises the low impedance decay means allowing the load current to decay slowly from the first current level to the second level to provide during such slow decay a load current sufficient to maintain actuation of the inductive load.

The end of the load actuation signal disables the second switch means to interrupt the second current path and thereby require the load current to decay rapidly through the high impedance decay means. In one embodiment of the invention, the second switch means comprise a SCR disabled by a final momentary turn ON of the first switch means.

Comparator means respond to the current levels through an inductive load to generate HIGH and LOW level outputs causing first switch means to connect and disconnect power to the load. When the load current initially exceeds a peak load actuation level, flip-flop means responsive to the corresponding change in comparator output levels change the current through an auxilliary sense resistor coupled to the sense input of the comparator means. In one embodiment, a one-shot multivibrator prevents a change in the current to the auxilliary sense resistor for a fixed period after the commencement of a load actuation signal. The subsequent HIGH and LOW comparator output levels are fed back to the comparator reference input to switch the reference voltage thereat so as to represent first and second levels of the current sufficient to maintain actuation of the load.

These and other objects and features of the present invention will become more apparent from the following written description taken in conjunction with the following figures wherein

FIGURES

FIG. 1 illustrates in block diagram form an engine control system in the form of a fuel injection control system utilizing one or more transduced engine dependent parameters to control the pulse duration of fuel injected into an internal combustion engine;

FIG. 3 illustrates in time coordinated form certain waveforms illustrative of the operation of the FIG. 2 embodiment.

FIGURE 1

Figure 2:
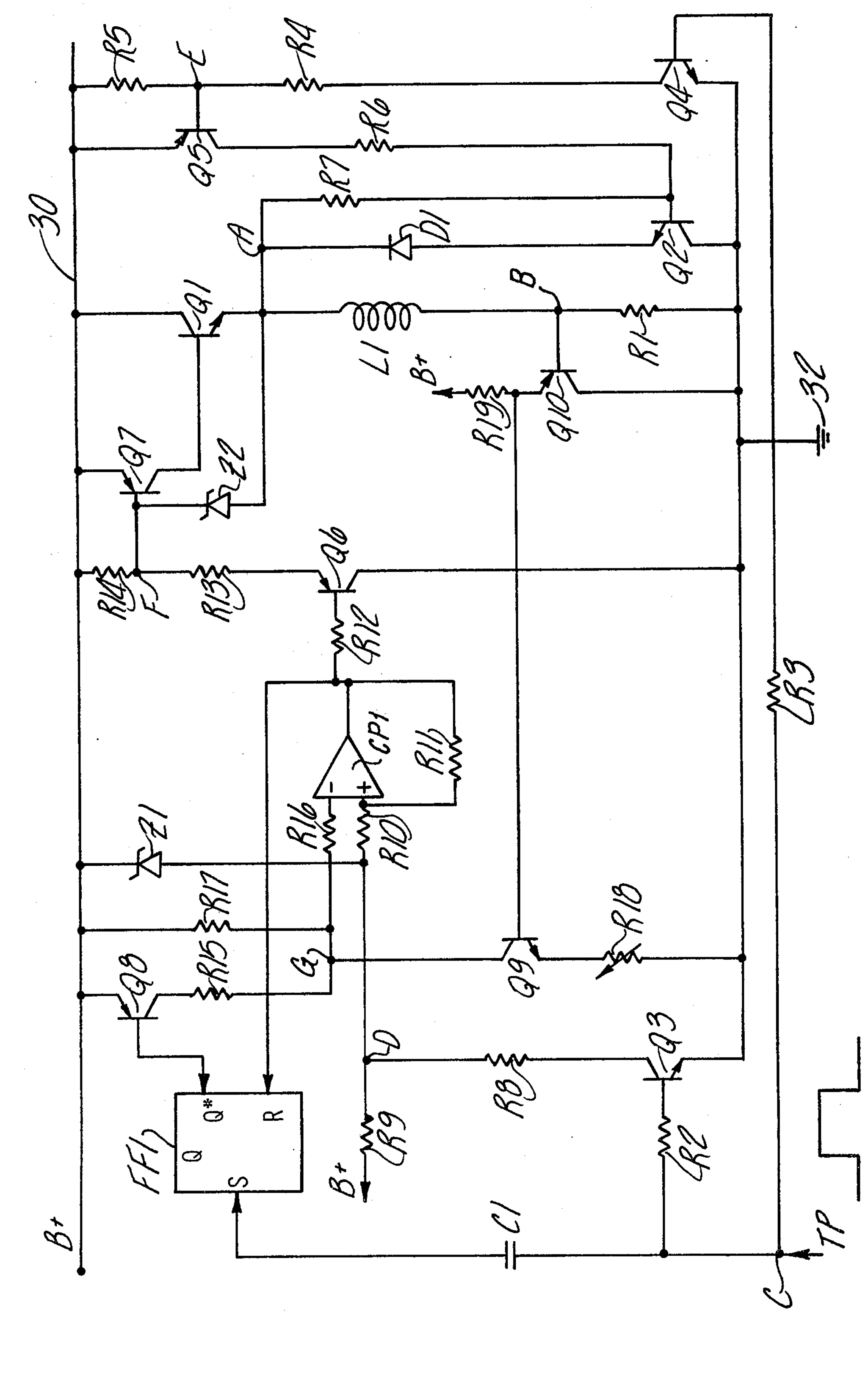
FIG. 2 illustrates in circuit schematic form one embodiment of the present invention.

The circuit of the present application may be utilized in combination with any inductive device requiring the precise control of actuation thereof with minimum expenditure of power. One such application is to control one or more electromagnetically-actuatable fuel injection valves to provide single, simultaneous, or grouped fuel pulses of controllable duration to certain solenoid controlled fuel inlet passages of an internal combustion engine.

One such fuel injection system may be of the type shown in the block diagram of FIG. 1. Therein, an injector drive circuit 10 of the present invention responds to injector actuation signals provided by a fuel injection control system 12 to control one or more injectors 14 to inject a precise quantity of fuel into a suitable fuel intake passage of internal combustion engine 16. The injector actuation signals are computed in response to one or more engine-dependent parameters communicated from engine 16 to fuel injection control system 12 by one or more engine transducers, such as RPM transducer 18, an intake manifold pressure transducer 20, an engine temperature transducer 22, or an engine roughness sensor 24.

Fuel injection control system 12 may be of the type disclosed in commonly-assigned U.S. Pat. Nos. 3,734,068 and RE 29,060 issued to Reddy respectively on May 22, 1973 and Dec. 7, 1976 the disclosures of which are hereby expressly incorporated herein by reference. As disclosed more fully therein, during one portion of an engine cycle, a capacitor is initialized to a starting value in accordance with one engine-dependent parameter such as the magnitude of a speed-dependent trigger signal as developed by RPM transducer 22. In the next portion of the engine cycle the capacitor is charged with a ramp voltage, the slope of which may be modified in accordance with a temperature signal as developed by temperature transducer 22. Comparator means then compare the resulting magnitude of this ramp voltage with a reference signal in the form of a pressure signal, as developed by a pressure transducer 20 which may be of the type disclosed in the commonly-assigned U.S. Patent application Ser. No. 739,400 filed for Reddy on Nov. 16, 1976. The comparator means generates an injector actuation signal $T_P$ having a duration beginning at the start of the second portion of the engine cycle and ending when the ramp voltage exceeds the pressure reference. The injector actuation signal may be further modified as disclosed in the commonly-assigned patent to Taplin et al U.S. Pat. No. 3,789,816 using a roughness signal as developed by a roughness sensor which may be of the type shown in commonly-assigned United States patent application Ser. No. 729,317 filed by Reddy on Oct. 4, 1976.

The fuel injection valve 14 may be of the type disclosed in commonly-assigned U.S. Pat. No. 4,030,668 issued on June 21, 1977 to Kiwior, the disclosure thereof being hereby expressly incorporated herein by reference. The fuel injection valve described comprises electromagnetic coil means operative when suitable energized to apply a motion-imparting magneto-motive force to armature means of a movable actuator means. The actuator means are moved against the bias of a closing spring from a closed position whereat valve head means carried by the actuator means seat on valve seal means to an open position whereat a radial shoulder element of the actuator means abuts a radial surface fixed with respect to the valve body in which the actuator means reciprocate.

FIGURE 2

FIG. 2 shows one embodiment of the present invention, the operation of which is explained in conjunction with the waveforms shown in FIG. 3.

In FIG. 3, waveform *3a* represents an injector actuation signal $T_P$, the width of which is generated to control the opening and closing of one or more fuel injectors. Waveform *3b* illustrates the application of either a regulated voltage or an unregulated voltage B+ to one side of the solenoid coil of an injector. Waveform *3c* illustrates the current through the solenoid coil, $I_o$ being the current at which the injector armature begins to move from its closed to its open position, $I_P$ being a current slightly in excess of the current at which the injector always fully opens, $I_{HL}$ being a lower level of holding current slightly in excess of the current level at which the injector armature begins to drop out, and $I_{HH}$ being a higher level of holding current in excess of the lower holding level. $\tau_1$ is the effective decay constant associated with the decay of current from $I_{HH}$ and $I_{HL}$ and $\tau_2$ is the effective decay constant associated with the return of the injector armature from its open to its closed position.

In the FIG. 2 embodiment, inductor L1 represents the solenoid coils of one or more electromagnetically-actuated fuel injection valves 14. First switch means in the form of a suitable NPN power transistor Q1 couples one side A of coil L1 and a load conductor 30, here connected to the high or B+ side of a suitable power supply. Coil current sensing means in the form of a small ohmage current sensing resistor R1 couples the other side B of coil L1 and a second load conductor 32, here connected to the ground side of the power supply. Connected in series between ground conductor 32 and coil side A are controllable coil current decay means here in the form of an NPN transistor Q2 and unidirectional current conducting means in the form of diode D1.

When rendered conductive as will be discussed shortly, power transistor Q1 completes a first current path to and through coil L1 and sensing resistor R1, such path comprising B+ conductor 30 and the emitter-to-collector junction of Q1. When rendered non-conductive, power transistor Q1 interrupts this first current path. Transistor Q2 when rendered conductive completes a second current path to and through coil L1 and sensing resistor R1, such second path comprising the ground conductor 32, the collector-to-emitter junction of transistor Q2, and anode-to-cathode junction of diode D1. And when rendered non-conductive, transistor Q2 interrupts this second current path.

To enable both power transistor Q1 and decay transistor Q2 during the presence of an injector actuation signal TP at terminal C, the terminal is coupled respectively to the base of an NPN input transistor Q3 by an input resistor R2 and to the base of another NPN input transistor Q4 by another input resistor R3. The Q3 collector is coupled to B+ by series-connected resistors R8 and R9 and, at a node D therebetween, is coupled by resistor R10 to the non-inverting input of a comparator CP1. A Zener diode Z1 having its anode connected to node D and its cathode coupled to B+ conductor 30 is operative, for the duration of an injector actuation signal TP at the Q3 base, to clamp the voltage at node D at a reference voltage of B+ less the breakdown voltage of the Zener Z1.

The Q4 emitter is grounded at conductor 32, and the Q4 collector is coupled to B+ conductor 30 by series-connected resistors R4, R5 and at a node E therebetween is coupled to the base of a PNP transistor Q5. The Q5 emitter is coupled to B+ conductor 30, and the Q5 collector is coupled by resistor R6 to the base of transistor Q2 and therefrom by resistor R7 to point A. An injector actuation signal TP saturates transistor Q4 and through transistor Q4 enables transistors Q2 and Q5 to saturate whenever the potential at coil side A is sufficiently below that of coil side B.

Comparator CP1 may be a conventional operational amplifier such as a 2901 quad comparator of the type that produces HIGH and LOW output levels, here of B+ and Zero volts, when the voltage at its non-inverting input is respectively greater and less than the voltage at its inverting input. In the FIG. 2 embodiment, the voltages at the inverting input and non-inverting input are both referenced to that of B+ conductor 30 and respectively comprise a sense voltage and a reference voltage. As will be explained more fully shortly, the voltage at the inverting input of CP1 drops below B+ with increasing current through coil L1.

The output of comparator CP1 is coupled by a feedback resistor R11 back to the non-inverting input and is coupled by another resistor R12 to the base of a first PNP drive control transistor Q6. The Q6 collector is connected to ground conductor 32, and the Q6 emitter is coupled to B+ conductor 30 by series-connected resistors R13 and R14 to suitably bias, at a node F therebetween, the base of a second PNP drive control transistor Q7. The Q7 emitter is coupled to B+ conductor 30, and the Q7 collector is connected to the Q1 base. A Zener diode Z2 having its anode coupled to the Q1 emitter at coil side A and its cathode coupled to the B+ conductor 30 through resistor R14 protects both transistors Q1 and Q7 against the possibly-damaging reverse voltages effected by the inductive kicks produced when transistor Q1 interrupts the first current path to coil L1.

Representative of a one circuit location responsive to the attainment of the peak current the output of comparator CP1 is also connected to the reset input R of a flip-flop FF1. The set input S of flip-flop FF1 is coupled by a capacitor C1 to the injector actuation terminal C and in response to a positive-going set input produces both a HIGH level output at one output terminal Q and a LOW level output at another output teminal Q*. The LOW level output Q* is connected to the base of a PNP transistor Q8, the emitter of which is connected to B+ conductor 30. The Q8 collector is coupled to the inverting input of comparator CP1 by series-connected resistors R15 and R16, and the node G therebetween is coupled by a resistor R17 to B+ conductor 30.

The exact values of voltage drop across resistors R15 and R17 needed to cause comparator CP1 to switch from one of its output levels to the other are determined by the relative values of resistors R10 and R11 and the voltage thereacross. These points may be computed assuming a B+ of 14 volts, R10 and R11 values of 10K and 100K respectively, and a 5.6 volt breakdown voltage for Zener Z1.

With a zero output level from comparator CP1, as exists to complete the first current path to coil L1, the voltage across resistors R10 and R11 is B+ less the breakdown voltage of Zener Z1. The reference voltage resulting at the non-inverting CP1 input is therefore below 14 volts by an amount equal to the difference between 14 volts and the Zener breakdown times the 0.9 ratio of resistances R10/R10+R11, or $(14-5.6)\ 0.9=14-7.6=6.4$ volts. With a HIGH output level for comparator CP1 of 14 volts as exists to interrupt the first current path, the voltage across resistors R10 and R11 decreases to 5.6 volts which when multiplied by the 0.9 ratio of resistance R10/R10+R11 results in a second reference voltage at the non-inverting CP1 input terminal of about 5.1 volts below B+.

In other words, the magnitude of feedback resistor R11 cooperates with the magnitude of input resistor R10 and the magnitudes of the two different CP1 output levels (here Zero and B+) to vary reference voltage at the non-inverting CP1 input between 6.4 volts below B+ when the CP1 output is zero volts and 5.1 volts below B+ when the CP1 output is 14 volts. As will be discussed shortly, when resistor R15 is connected in parallel with resistor R17 to set the current dropping the voltage from B+, these reference voltages and the "hysteresis" between them, determine the peak opening current level $I_P$, FIG. 3c, and the lower level of the hold current $I_{HL}$ and the difference between them. These reference voltages also determined the higher level of the hold current level $I_{HH}$ and lower hold current level $I_{HL}$, and the difference between them, when resistor R15 is not used to set the current dropping voltage from B+.

To generate a voltage corresponding to that produced across sensing resistor R1, node G is also coupled to the collector of an NPN transistor Q9, the emitter of which is coupled by a variable resistor R18 to ground conductor 32. The Q9 base is coupled to B+ conductor 30 by resistor R19 and also to the emitter of a PNP transistor Q10, the collector of which is grounded at conductor 32. The Q10 base is coupled to the current sensing resistor R1 at coil side B and the Q10 base-to-emitter voltage drop is selected to negate the Q9 base-to-emitter drop.

As will be discussed shortly, when the injectors are being opened, transistors Q9 and Q10 cooperate with resistors R15 and R17 to develop a very small current that produces across resistor R18 a voltage representing that developed across current sense resistor R1 with a much larger injector opening drive current. After the injectors have opened and the current thereto is reduced to just hold them open, transistors Q9 and Q10 cooperate with resistors R17 and R18 to produce a second very small current that produces across resistor R18 a voltage representing that produced across resistor R1 with a much larger injector holding current. Thus, assuming each injector requires a peak current of 1.5 amps to open and current of 0.4 amps to hold it open, a voltage drop of 0.15 volts would be produced across a sensing resistor R1 of 0.1 ohms by the 1.5 amp peak opening current $I_P$ and 0.04 volts would be produced by the 0.4 amp holding current. Assuming the circuit of FIG. 2 drives eight injectors at a time, the required total opening current of 12 amps and total current of 3.2 amps would produce respective volt drops across sensing resistor R1 of about 1.2 and 0.32 volts and corresponding voltage drops would be produced across resistor R18.

The magnitude of the R18 resistance is adjusted so that, with transistor Q8 biased ON, the peak current through resistance R18 produces a voltage drop across resistance R15 in parallel with a resistance R17 just exceeding the 6.4 volt drop to the non-inverting input of comparator CP1. Assuming values of resistances R15 and R17 respectively of 5 K ohms and 10 K ohms and a 5.6 volt breakdown for Zener Z1, this 6.4 volt drop to the non-inverting CP1 input when divided by the 3.3K parallel resistance of R15 and R17 would produce therethrough a current of about 1.93 milliamps. Then to match the 1.2 volt drop produced across resistor R1 by the 12 amp peak opening current with these 1.93 milliamps across R18, the value of R18 would be set at about 625 ohms.

As will be explained more fully shortly, after the peak opening current is detected by comparator CP1, the resulting HIGH output therefrom resets flip-flop FF1. The HIGH Q* output stops current flow through resistor R15 and causes just resistor R17 to determine both the sense voltage at the inverting input of comparator CP1 and the magnitude of the current through resistor R18 associated with the higher and lower levels of the hold current. Resistance R17 reduces to 0.51 milliamps the current required to exceed the now 5.1 volt drop to the non-inverting input of comparator CP1 and these 0.51 milliamps in turn produce about a 0.32 volt drop across resistor R18 corresponding to a lower level of hold current of about 3.2 amps.

In the operation of the embodiment illustrated in FIG. 2, prior to the beginning of an injector actuation signal TP, transistors Q3 and Q4, and through Q4 transistors Q2 and Q5, are biased OFF. Until set by the beginning of an injector actuation signal TP, flip-flop FF1 produces a HIGH voltage at its Q* output, thereby biasing Q8 OFF. With B+ voltage coupled to the non-inverting input of comparator CP1 by resistors R9 and R10, that input controls and comparator CP1 produces a HIGH level output, thereby biasing OFF transistors Q6 and in turn Q7 and Q1. With no current flowing through sensing resistor R1, transistor Q10 and therefore transistor Q9 are biased OFF and essentially no current is drawn across resistor R17.

Concurrent with the beginning of the an injector actuation signal TP, the leading positive-going edge thereof is differentiated by capacitor C1 to provide a set pulse to the set input S of flip-flop FF1. The resulting LOW level produced at the Q* output of flip-flop FF1 biases ON transistor Q8 so that the voltage at node G to inverting input of comparator CP1 is then that on B+ conductor 30 less that developed across the parallel combination of resistors R15 and R17. However, immediately after the beginning of a TP signal, the voltage at the inverting input is still close to B+ while the voltage at the non-inverting CP1 input is dropped to B+ less the Zener breakdown. The higher voltage at the inverting CP1 input then causes the comparator CP1 to produce a LOW output to bias ON transistor Q1 through transistors Q6 and Q7.

As the current to coil L1 builds up toward the 12 amp peak opening current $I_P$, the current through resistors R1 and R18 also builds. When the R18 current exceeds 1.73 milliamps, this current produces a voltage drop of greater than 6.4 volts across resistors R15 and R17, thereby lowering the voltage at node G to the inverting input below that at the non-inverting input. With a greater voltage resulting at its noninverting input, comparator CP1 produces a HIGH level output, biasing OFF transistor Q6 and therethrough transistors Q7 and Q1.

When output of comparator CP1 switches to a HIGH level output, this output resets flip-flop FF1 to produce a HIGH level output at its Q* terminal and in turn to bias OFF transistor Q8. With transistor Q8 OFF, just resistor R17 develops the voltage drop from B+ to the inverting input of comparator CP1 and does so with less current since the resistor R15 no longer is in parallel with resistor R17.

With transistor Q1 biased OFF, the first current path to coil L1 is interrupted to allow the current therethrough to decay and to thereby reverse the voltage induced thereacross so that side B is positive with respect to side A. With its collector now at a lower voltage than its base, previously enabled transistor Q5 completes a biasing circuit to the Q2 base across R7. With its emitter now at a lower potential than its base, previously enabled transistor Q2 now completes the second current path to provide replenishment current from ground conductor 32 through diode D1, coil L1, and sensing resistor R1.

The effective impedance to the current decaying through this second path comprises approximately 0.3 ohms representing the parallel equivalent of an internal resistance of 2.3 ohms for each of eight parallelly-connected injectors plus 0.016 ohms produced by 12 amps across the 0.2 volt drop of 0.1 volt each across transistor Q2 and diode D1. Dividing this effective 0.316 ohm impedance into the 1.67 millihenry equivalent of an inductance of eight parallelly-connected injectors of 13.25 millihenries each fixes the L/R decay time constant $\tau_1$ of this circuit at about 5.3 milli-seconds and thereby fixes the period required to decay from one known level to another.

Thus, the coil current decays at essentially this rate from 12 amps to the lower holding level $I_{HL}$ of about 3.2 amps where the voltage across resistor R17 at the inverting input of the comparator CP1 is less than the now 5.1 volt drop to the non-inverting CP1 input. To develop 5.1 volts across the 10K resistor R17 requires about 0.51 milliamps which produces a 0.32 volt drop across R18.

When the injector current decays just below 3.2 amps, the voltage drop across R17 to the inverting input of the comparator CP1 decreases below the 5.1 volts dropped to the noninverting CP1 input so that the voltage at the inverting CP1 input is greater than at the non-inverting input. With the inverting input then controlling, comparator CP1 again produces a zero level output biasing ON transistor Q1 through transistors Q6 and Q7 and increasing the reference voltage at the CP1 non-inverting input to a 6.4 volt drop from B+.

The injector current then increases again until 6.4 volts is again effected to the inverting input across now just resistor R17. This drop is effected by 0.64 milliamps across resistor R17 which produces a drop of about 0.4 volts across resistor R18. A drop of 0.4 volts across resistor R18 corresponds to a similar drop across resistor R1 and therefore to an injector current of 4 amps thereacross.

The injector current thereafter is cycled between the lower and the higher levels of holding current of 3.2 and 4 amps respectively until the end of the injector actuation signal TP. At that instant the injector current would be at some unknown value between 3.2 and 4 amps. If the second current path were still enabled, the coil current would require some unknown time up to one millisecond to decay below the low holding level of 3.2 amps. Since an uncertainty of up to a millisecond in the closing time of the injector would detract from the precision required for fuel injection, the second current path is thus immediately disabled with the end of the injector actuation pulse to require the coil replenishment current to be supplied through a much faster decay circuit comprising Zener Z2. Assuming a breakdown voltage of 33 volts for Zener Z2, an effective resistance of about 8 ohms is presented by this Zener to a 4 amp holding level current. Combining these effective resistances with the 0.3 ohm the equivalent internal resistance of the eight 2.3 ohm injector coils results in a total effective resistance of 8.3 ohms. Dividing the 1.67 millihenry effective inductance of eight 13.25 millihenry injector coils results in a L/R decay time constant $\tau_2$ of about 0.2 milliseconds. This 0.2 millisecond decay constant $\tau_2$ is more than 20 times faster than the decay constant $\tau_1$ effected by the second current path and effectively eliminates variations in closing times as a factor degrading precision of fuel injection.

FIG. 4

Figure 4:
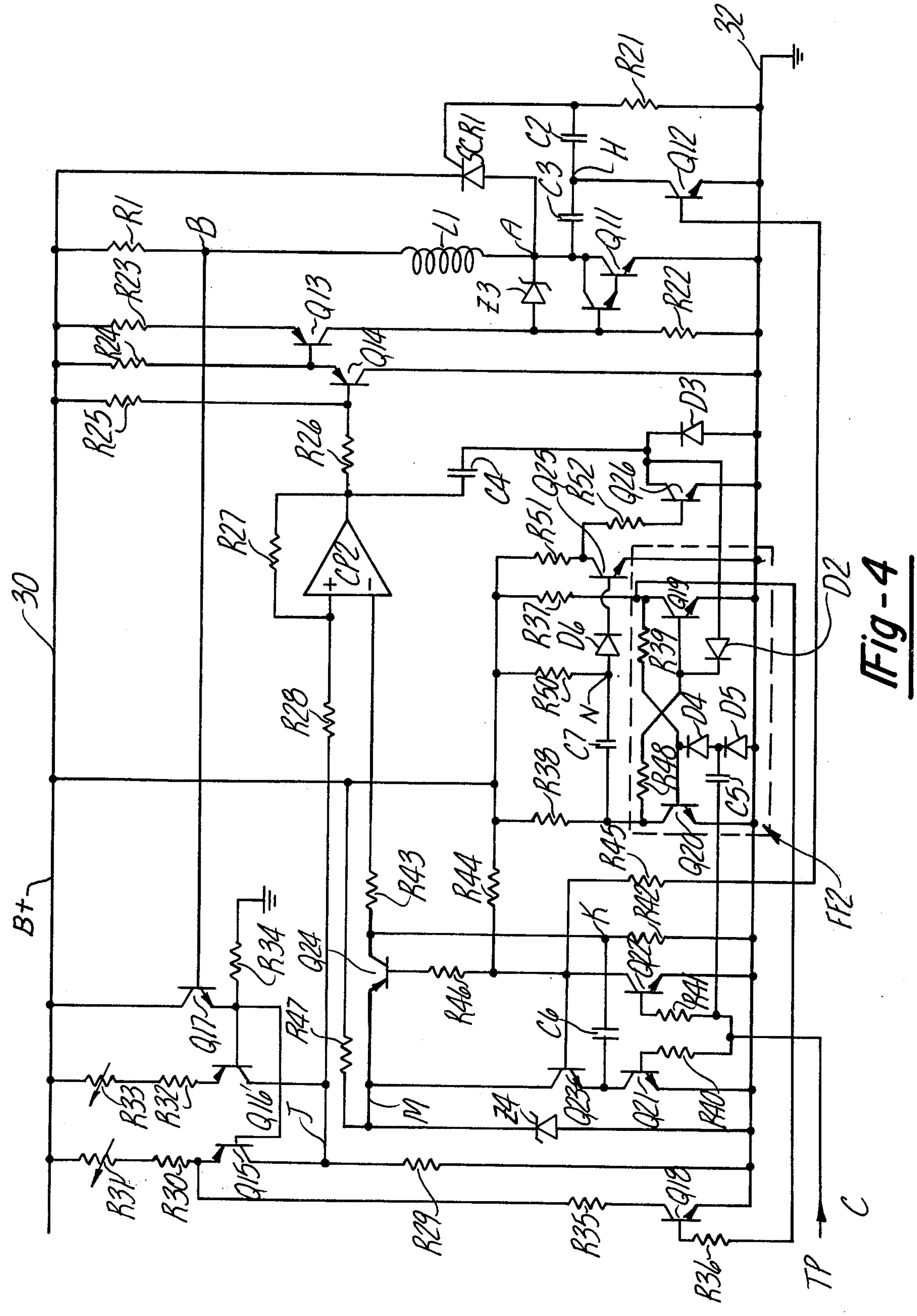
FIG. 4 illustrates in circuit schematic form a second embodiment of the present invention.

In the alternative embodiment of the invention illustrated in FIG. 4, the current sense resistor R1 is located on the B+ side of each injector so that the voltage across the sense resistor is measured with respect to B+ rather than with respect to ground. Also, to reduce the power loss and added heating associated with driving the decay transistor Q2, this device is replaced by a silicon controlled rectifier SCR 1, which does not require a continuous drive but does require additional control circuitry to effect turn on and turn off. Also, to assure that the injectors pull-in in the presence of increases in the supply voltages to levels where the rise time of current might be faster than the mechanical response time of the injectors, the FIG. 4 embodiment also comprises circuitry for holding the peak opening current $I_P$ for at least a minimum fixed period.

Again, inductor Coil L1 represents the solenoid coils of one or more electromagnetically-actuated fuel injector valves 14 to be driven singly, simultaneously, or in groups with power supplied between a B+ conductor 30 and a ground conductor 32. First switch means in the form of Darlington connected NPN transistors Q11, such as a RCA expitaxial TA 8997, couples one side A of coil L1 and ground conductor 32, and a small ohmage current sensing resistor R1 couples the other side B of coil L1 to the B+ conductor 30. Coil side A is also coupled directly to the anode of a silicon controlled rectifier SCR 1, the cathode of which is coupled to the B+ conductor 30. Coil side A is also coupled to the gate of SCR 1 by a pair of series connected capacitors C2 and C3 and to ground 32 by a resistor 21.

Whenever transistor Q11 is biased OFF, during a TP signal the resulting back-emf-induced voltage rise at coil side A is communicated by capacitors C2 and C3 to the gate of SCR 1 to turn ON SCR 1 until reverse biased OFF again by a subsequent turn ON of Q11. To insure that SCR 1 does not come ON when an injector actuation signal TP is not present, the node H between capacitors C2 and C3 is coupled to the collector of an NPN transistor Q12 and is grounded therethrough during a TP* signal, the complement of the TP signal.

To be able to alternately complete and interrupt a first current path from coil side A through transistor Q11 to ground 32, the Q11 base is coupled to ground 32 by a resistor 22 and also to B+ 30 by a resistor 23 connected in series to the Q11 base by the emitter-to-collector junction of a PNP transistor Q13. The Q13 base is connected to the emitter of a PNP transistor Q14 and to B+ 30 by a resistor R24. The Q14 collector is grounded at 32, and the Q14 base is coupled by a resistor R25 to B+ conductor and by a resistor R26 to the output of a comparator CP2.

Comparator CP2 has an inverting input and a non-inverting input, here comprising the reference and sense inputs, respectively. The CP2 output is coupled by a resistor R27 to the CP2 non-inverting input, which is coupled to ground 32 by series connected resistors R28 and R29 having a node J therebetween. Coupled to the node J are the collectors of a pair of PNP current source transistors Q15 and Q16 each of which comprise an emitter follower circuit with an NPN transistor. The Q15 emitter is coupled to B+ R30 by a fixed resistor R30 and a variable resistor R31, and similarly the Q16 emitter is coupled to B+ 30 by a fixed resistor R32 and a variable resistor R33. The Q15 and Q17, bases are both coupled by a resistor R34 to ground 32 and by the emitter-to-base junction of transistor Q17 to coil side B. The Q17 collector is coupled to B+ conductor 30. With the base-to-emitter drop of transistor Q17 matching the base-to-emitter rises of transistor Q15 and Q16, the Q15 and Q16 emitters therefore follow the voltage at point B to provide currents through resistors R30–R31 and R32–R33, each varying directly with the current through sensing resistor R1. Summed at node J, these Q15 and Q16 currents develop a voltage across resistor R29 varying with the injector current. To selectively bias OFF transistor Q15 and stop current therethrough to resistor R29 after the pull-in level $I_P$ of injector current is attained, the Q15 emitter is coupled to ground conductor 32 by the series connection of a resistor R35 and the emitter-to-collector junction of an NPN transistor Q18.

The output of comparator CP2 is also coupled by a capacitor C4 and a diode D2 to the base of an NPN transistor Q19 of a flip-flop FF2 also comprising a second NPN transistor Q20. (Another circuit location responsive to the attainment of the peak current to which flip-flop FF2 might be coupled by capacitor C4 and Diode D2 is the emitter of Darlington transistor Q13. This circuit location provides more current and power than the uncommitted emitter in the 2901 quad comparator CP2.) The Q19 collector is coupled by a resistor R36 to the Q18 base, and the Q19 and Q20 collectors are coupled by respective resistors R37 and R38 to B+ conductor 30 and by resistors R39 and R48 to the Q20 and Q19 bases respectively. The Q19 and Q20 emitters are grounded at 32.

Injector actuation terminal C is coupled by a capacitor C5 to the node between diodes D4 and D5 connected forwardly in series from ground 32 to the Q20 base. Terminal C is also coupled by resistors R40 and R41 to the bases of NPN transistors Q21 and Q22 respectively. The Q21 collector is series-connected to ground 32 by a capacitor C6 and a resistor R42 having a node K therebetween coupled by a resistor R43 to the inverting CP2 input. The Q22 collector is coupled to B+ conductor 30 by a resistor R44 and by a resistor R45 to the Q12 base. An injector actuation signal TP biases ON transistor Q22 and biases OFF transistor Q12 through the Q22 collector-to-emitter junction. When an injector actuation signal $T_P$ is not present, the resulting HIGH Q22 collector voltage produces the TP* signal biasing ON transistor Q12.

Also coupled to the Q22 collector is the base of an NPN transistor Q23, the collector of which is coupled by a resistor R47 to B+ conductor 30 and the emitter of which is coupled to capacitor C6 and the collector of a transistor Q21. When the TP signal is present, resistor R46 and the Q22 collector-to-emitter junction are coupled within the base of a PNP transistor Q24 to ground 32, thereby biasing ON transistor Q24 and coupling the breakdown voltage of a Zener diode Z4 to the inverting input of comparator CP2.

Even though the SCR 1 gate signal is effectively grounded by transistor Q12 by the fall of the TP signal, the SCR 1 is not cut off until reverse biased. To provide a short (approximately 50 microsecond) reverse bias to SCR 1 upon the fall of the TP signal, the Q21 collector voltage rising with the fall of the TP signal is coupled by capacitor C6 and resistor R43 to the inverting CP2 input causing a positive spike thereat producing a momentary LOW level output turning ON transistor Q11. The momentary turn ON of transistor Q11 quickly diverts the current through SCR1 to quickly turn it OFF.

An additional feature afforded by the FIG. 4 embodiment are means to assure that the coil current is not dropped below the peak pull-in current before a minimum time has elapsed from the beginning of an injector actuator signal. Such protection is desirable where the combination of a higher-than-normal B+ supply and/or a slower responding injector would otherwise cause the coil current to exceed the peak pull-in current and then drop back to the holding level before the injectors have in fact opened. To avoid this possibility, the comparator CP2 is caused to maintain a LOW level output for at least a minimum period such as 1.5 milliseconds after the beginning of an injector actuation command. This minimum period is generated by timing means in the form of a one-shot monostable comprising a resistor R50 coupling B+ conductor 30 to a node N between a capacitor C7 and a diode D6 connected in series between the collector of flip-flop transistor Q20 and the base of an NPN transistor Q25. The Q25 collector is coupled by a resistor R51 to B+ conductor 30 and by a resistor R52 to the base of an NPN transistor Q26, the emitter of which is grounded at 32. The Q26 collector is coupled to the output of comparator CP2 by capacitor C4 and to the node between diodes D2 and D3 connected in series between ground 32 and the base of flip-flop transistor Q19.

As will be discussed more fully shortly, the beginning of an injector actuation signal TP causes flip-flop transistor Q20 to ground one side of capacitor C7. This momentarily biases OFF one-shot transistor Q25 and biases ON transistor Q26 to ground the CP2 output. If, during the short 1.5 millisecond period that one-shot capacitor C7 charges through resistor R50, the sense voltage at the non-inverting CP2 input exceeds the reference voltage at the inverting CP2 input, the resulting HIGH level output of comparator CP2 would be diverted to ground through transistor Q26 and would not be communicated to the Q19 base until after the short one-shot period. Thus inhibited for the one-shot period, transistor Q19 would therefore not bias OFF transistor Q18 to downshift the reference voltage to the non-inverting input of comparator CP2 until both the one-shot period had elapsed and the coil current exceeded the peak opening current level.

In operation of the FIG. 4 embodiment, prior to the receipt at terminal C of an injector actuation signal TP, all transistors are biased OFF with the exception of flip-flop transistor Q19, the one-shot transistor Q25 and transistor Q12 which is biased ON by the Q22 collector voltage TP* thereby grounding the SCR 1 gate. With the Q24 base coupled to B+ conductor 30 by resistors R44 and R46, transistor Q24 is bised OFF so that the inverting input is clamped to ground 32 by resistors R42 and R43. The non-inverting CP2 input therefore controls to produce a HIGH CP2 output biasing OFF power transistor Q11 through control transistors Q13 and Q14. No current therefore flows through Coil L1.

With the presence of an injector actuation pulse TP, the rise thereof is communicated to the Q21 and Q22 bases by resistors R40 and R41, biasing ON transistors Q21 and Q22. The Q12 base is grounded through transistor Q22 and resistor R45 to bias OFF transistor Q12, thereby enabling SCR 1 by removing the ground to the SCR 1 gate. The rise of the TP actuation signal is also communicated by capacitor C5 and diode D4 to the base of flip-flop transistor Q20, biasing ON transistor Q20 and therethrough grounding the bias to flip-flop transistor Q19. The B+ voltage at the Q19 collector biases ON shunt transistor Q18 to reverse bias current source transistor Q15 and through transistor Q18 and resistor R35 the current that would otherwise flow through current source transistor Q15.

With its base now grounded through resistor R46 and transistor Q22, transistor Q24 is biased ON to communicate the breakdown voltage of Zener Z4 to the inverting input of comparator CP2. With no voltage drop developed across resistor R29 until current begins to flow through coil L1, the Zener breakdown voltage at the inverting input of comparator CP2 produces a LOW level output biasing ON control transistor Q13 and Q14 to develop a voltage across resistor R22 biasing ON power transistor Q11.

As the coil current begins to build up, the voltage across sensing resistor R1 increases lowering the potential at coil side B. The Q16–Q17 current source-emitter follower circuit causes the voltage drop across resistors R32–R33 to correspond closely to that across sensing resistor R1. Thus, increasing with the current through sensing resistor R1, coil L1, and transistor Q11, the Q16 current at node J develops a voltage across resistor R29 increasing with that across sensing resistor R1.

Variable resistor R33 was previously set so that the Q16 current caused the voltage across resistor R29 to just exceed the breakdown voltage of Zener Z4 at a value of coil current slightly in excess of the solenoid pull-in current $I_P$ under worst-case conditions. Representative switching points may be computing assuming representative circuit values shown in the Table of Component Values below. That is a minimum pull-in current $I_P$ of 12 amps, a low level of hold current $I_{HL}$ of 3.2 amps, a HIGH and LOW level CP2 outputs corresponding respectively to 14 volts and zero.

Then, when the CP2 output is LOW, as is initially the case until the 12 amp pull-in current is exceeded, the sense voltage at the non-inverting CP2 input is that developed across resistor R29 multiplied by the 0.9 ratio of R27/R27+R28 (i.e., 0.9=100/(100+10). Thus, to exceed the 4.3 volts reference at the inverting CP2 input, about 4.8 volts must be developed across the 3.6K resistance of R29, requiring about 1.33 milliamps thereacross. To provide this 1.33 milliamp current when the minimum pull-in current of 12 amps is just exceeded, resistors R32–R33 must be set to develop the same 1.2 volts developed across sense resistor R1. To develop 1.2 volts with 1.33 milliamps, the resistance of resistors R32 and R33 must be set at 900 ohms.

If more than the 1.5 millisecond delay of the one-shot has elapsed when the 4.3 volt reference at the inverting input of comparator CP2 is exceeded for the first time, the resulting 14 volt HIGH output is communicated by capacitor C4 and diode D2 to the base of flip-flop transistor Q19, thereby biasing ON transistor Q19 and therethrough biasing OFF shunt transistor Q18. The voltage at the non-inverting sense input of comparator CP2 is now the voltage developed across resistor R29 the 14 volt CP2 output less the voltage developed across resistor R29 multiplied by 0.9. Thus, to fall below the 4.3 volt reference at the inverting CP2 reference input when the CP2 output is 14 volts, about 3.3 volts must be developed across R29, requiring about 0.9 milliamps therethrough. These 0.9 milliamps are provided through current sources transistors Q15 and Q16 in developing a 0.32 volt drop across resistors R30–R31 and R32–R33, corresponding to the lower hold level current of about 3.2 amps. This requires that the resistors R30–31–32–33 provide an equivalent resistance of about 350 ohms, meaning that R30 and R31 be about 570 ohms since resistors R32 and R33 were previously set at 900 ohms.

TABLE OF REPRESENTATIVE VALUES

The following is a table of representative values and designations of components that may be used to embody the circuits illustrated in FIGS. 2 and 4

TABLE OF COMPONENTS

| Resistors (Ohms) | | | | | | Zener (Breadown) Voltage) | | |
|---|---|---|---|---|---|---|---|---|
| R1 | 0.1 | R21 | 4.7K | R41 | 10K | Z1 | 5.6 | IN4734A |
| R2 | 10K | R22 | 100 | R42 | 10K | Z2 | 27 | IN4750A |
| R3 | 10K | R23 | 68 | R43 | 10K | Z3 | 43 | IN4755A |
| R4 | 560 | R24 | 2.2K | R44 | 6.8K | Z4 | 4.3 | IN4731A |
| R5 | 10K | R25 | 4.7K | R45 | 10K | | | |
| R6 | 33 | R26 | 1.1K | R46 | 22K | Capacitors (Microfarads) | | |
| R7 | 50K | R27 | 100K | R47 | 2.2 | | | |
| R8 | 2.2K | R28 | 10K | R48 | 22K | Cl | 0.001 | |
| R9 | 6.8K | R29 | 3.6K | R49 | | C2 | 0.0068 | |
| R10 | 10K | R30 | 330 | R50 | 50K | C3 | 0.0068 | |
| | | | | | | C4 | 0.05 | |
| R11 | 100K | R31 | 0–1K | R51 | 10K | C5 | 0.05 | |
| R12 | 6.8K | R32 | 330 | R52 | 10K | C6 | 0.05 | |
| R13 | 560 | R33 | 0–1K | | | C7 | 0.05 | |
| R14 | 1K | R34 | 3.3K | | | | | |
| R15 | 5K | R35 | 2.2K | | | Transistors and Diodes | | |
| R16 | 10K | R36 | 22K | | | All NPNs-MPSA05-Motorola | | |
| R17 | 10K | R37 | 4.7K | | | All PNPs-MPSA55-Motorola | | |
| R18 | 0–1K | R38 | 4.7K | | | Q11 2N6387-RCA | | |
| R19 | 33K | R39 | 22K | | | SCR 1-Cl22D-G.E. | | |
| R20 | | R40 | 10K | | | Diode D1-MR754-Motorola | | |

-continued

| TABLE OF COMPONENTS | |
|---|---|
| Resistors (Ohms) | Zener (Breadown) Voltage) |
| | Other Diodes IN4004 |

CONCLUSION

Having described several embodiments of the invention, it is understood that the specific terms and examples are employed herein in a descriptive sense only and not for the purpose of limitation. Other embodiments of the invention, modification thereof, and alternatives thereof will be obvious to those skilled in the art and may be made without departing from our invention. We therefore aim in the appended claims to cover the modifications and changes as we would in the true scope and spirit of our invention.

What we claim is:

1. A circuit for controlling current from a power supply to the solenoid coil of an electromagnetically activated armature in response to a command pulse having a beginning and an end bounding an actuating portion and a holding portion, the current in said actuating portion increasing to an actuating current level sufficient to overcome a bias causing the armature to move from a first position to a second position and the current in said holding portion decreasing to a range sufficient to maintain the armature in said second position, said circuit comprising:

(a) power switch means coupled to said power supply and adapted to be coupled to a one of first and second sides of said solenoid coil, said power switch means responsive to first and second inputs thereto to alternately complete and interrupt a charging current path between said power supply and said solenoid coil;

(b) reference means for generating a lower and higher reference value representing respectively a lower level and a higher level of said holding current;

(c) comparator means coupled to said reference means, said power switch means, and a one of said first and second sides of said solenoid coil for comparing a representation of the current through the solenoid coil with said lower and higher reference values and generating said first input to said first switch means when said current through said solenoid is less than said lower holding level and generating said second input when said current through the solenoid coil is greater than said higher holding level;

(d) solenoid current decay means comprising low impedance means and high impedance means, said low impedance means coupled across both sides of said solenoid coil and being enabled by the presence of said command pulse to establish a low impedance current path through said solenoid coil when the charging current path is interrupted, said low impedance means comprising silicon controlled rectifier means, and said high impedance means coupled across both sides of said solenoid coil having an impedance value higher than said low impedance means to establish a high impedance current path through said solenoid coil;

(e) SCR turn off means coupled to said power switch means responsive to the termination of said command pulse to momentarily cause said power switch means to complete said charging current path so as to rapidly turn off said silicon controlled rectifier means by diverting current therefrom; and (f) said low and high impedance means cooperating with the inductance of said solenoid coil to establish respective slow and fast L/R decay rates for the current through the coil so that said slow L/R decay rate allows said holding current to flow through said solenoid coil prior to the end of said command pulse even though said power switch interrupts said path between said power supply and said solenoid coil and so that said fast L/R decay allows said armature to be rapidly biased back to its first position after the end of said command pulse.

2. The current control circuit of claim 1 wherein said SCR turn off means comprise timing means generating a fixed pulse coupled to said comparator means causing said comparator to switch from one of said first and second comparator output levels for the duration of said fixed pulse and to immediately thereafter switch back to the other of said first and second comparator output levels.

* * * * *